(12) United States Patent
Tan

(10) Patent No.: US 8,946,568 B2
(45) Date of Patent: Feb. 3, 2015

(54) ELECTRONIC COMPONENT ENCLOSURE AND ELECTRONIC APPARATUS

(71) Applicant: Shinko Electric Industries Co., Ltd., Nagano-shi, Nagano (JP)

(72) Inventor: Min Shong Tan, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 73 days.

(21) Appl. No.: 13/897,469

(22) Filed: May 20, 2013

(65) Prior Publication Data

US 2013/0313018 A1 Nov. 28, 2013

(30) Foreign Application Priority Data

May 22, 2012 (JP) .................................. 2012-116290

(51) Int. Cl.
*H01R 13/502* (2006.01)
*H05K 5/02* (2006.01)
*G06F 1/18* (2006.01)

(52) U.S. Cl.
CPC .............. *H05K 5/0221* (2013.01); *G06F 1/181* (2013.01)
USPC ............................ 174/561; 174/560; 361/737

(58) Field of Classification Search
USPC .................................. 174/560, 561; 361/737
See application file for complete search history.

(56) References Cited

U.S. PATENT DOCUMENTS

| | | | | |
|---|---|---|---|---|
| 5,574,254 | A * | 11/1996 | Mori et al. | 174/561 |
| 6,239,371 | B1 * | 5/2001 | Roosen et al. | 174/92 |
| 7,208,686 | B1 * | 4/2007 | Chen et al. | 174/561 |
| 8,173,912 | B2 * | 5/2012 | Buyukbas et al. | 174/561 |
| 8,426,752 | B2 * | 4/2013 | Hashikura et al. | 174/528 |
| 8,559,174 | B2 * | 10/2013 | Cheng et al. | 361/679.6 |
| 2010/0265675 | A1 | 10/2010 | Aoki et al. | |
| 2012/0031667 | A1 * | 2/2012 | Dai | 174/562 |

FOREIGN PATENT DOCUMENTS

JP 2010-258042 A 11/2010

* cited by examiner

*Primary Examiner* — Hung V Ngo
(74) *Attorney, Agent, or Firm* — Drinker Biddle & Reath LLP

(57) ABSTRACT

There is provided an electronic component enclosure. The electronic component enclosure includes: an upper enclosure and a lower enclosure. The upper enclosure includes: an upper plate portion; an upper sidewall portion extending from a periphery of the upper plate portion; and a hook member extending from the upper sidewall portion. The lower enclosure is engaged with the upper enclosure, and includes: a lower plate portion; a lower sidewall portion extending from a periphery of the lower plate portion; and a reception member extending from the lower sidewall portion and engaging with the hook member.

7 Claims, 9 Drawing Sheets

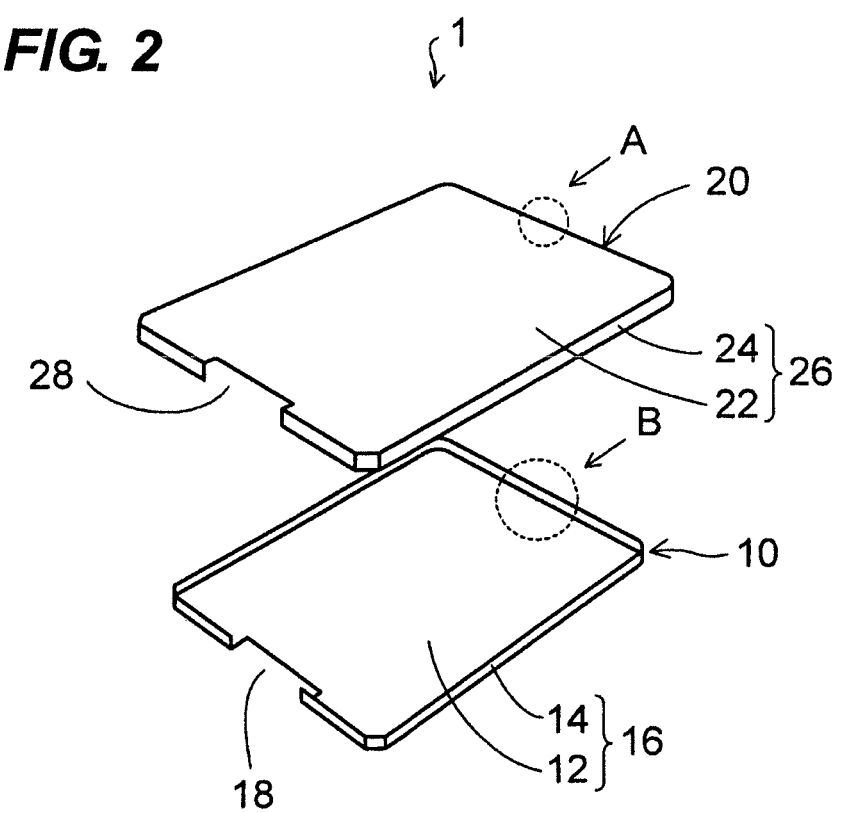

ELECTRONIC COMPONENT ENCLOSURE AND ELECTRONIC APPARATUS

This application claims priority from Japanese Patent Application No. 2012-116290, filed on May 22, 2012, the entire contents of which are herein incorporated by reference.

BACKGROUND

1. Technical Field

The present invention relates to an electronic component enclosure and an electronic apparatus mounted with the electronic component enclosure.

2. Description of the Related Art

An electronic apparatus is known in which an electronic component is received inside a casing having an upper enclosure fixed on a lower enclosure. According to an example of a related-art electronic apparatus, an engagement hole 140 is provided in a sidewall portion 120 of an upper enclosure 100 as shown in FIG. 1A.

In addition, as shown in FIG. 1B, an engagement protrusion 240 is provided on a sidewall portion 220 of a lower enclosure 200. When the upper enclosure 100 is outer-fitted to the lower enclosure 200 while the engagement protrusion 240 is engaged with the engagement hole 140, the lower enclosure 200 and the upper enclosure 100 are fixed to each other (see e.g., JP-A-2010-258042).

There is assumed a case where the engagement protrusion 240 of the lower enclosure 200 may come off the engagement hole 140 of the upper enclosure 100 when the related-art electronic apparatus falls down or receives a shock from the outside. In addition, a user may disengage the engagement protrusion 240 of the lower enclosure 200 from the engagement hole 140 of the upper enclosure 100 intentionally to open the casing.

Further, due to the structure in which the engagement protrusion 240 of the lower enclosure 200 is exposed from a side surface of the casing, the appearance does not look attractive. Therefore, there is still room to improve the designability.

SUMMARY OF THE INVENTION

It is one of objects of the present invention to provide an electronic component enclosure having a first enclosure and a second enclosure fixed to each other reliably, and an electronic apparatus mounted with the electronic component enclosure.

According to one or more illustrative aspects of the present invention, there is provided an electronic component enclosure. The electronic component enclosure comprises: an upper enclosure comprising: an upper plate portion having a first surface; an upper sidewall portion extending from a periphery of the upper plate portion in a perpendicular direction substantially perpendicular to the first surface of the upper plate portion, wherein the upper sidewall portion comprises a first surface contacting the first surface of the upper plate portion and a second surface opposite to the first surface; and a plurality of hook members extending from the upper sidewall portion and each comprising: a base portion having a first side and a second side opposite to the first side; a first spring plate portion connected to the first side of the base portion and comprising: a first end surface contacting the first side of the base portion; a second end surface opposite to the first end surface; and a first inclined upper surface between the first end surface and the second end surface, wherein the first inclined upper surface is inclined such that a distance between the first inclined upper surface and the second surface of the upper sidewall portion in the perpendicular direction is gradually increased toward the second end surface of the first spring plate portion; and a second spring plate portion connected to the second side of the base portion and comprising a first end surface contacting the second side of the base portion; a second end surface opposite to the first end surface; and a second inclined upper surface between the first end surface and the second end surface, wherein the second inclined upper surface is inclined such that a distance between the second inclined upper surface and the second surface of the upper sidewall portion in the perpendicular direction is gradually increased toward the second end surface of the second spring plate portion, a lower enclosure engaged with the upper enclosure, the lower enclosure comprising: a lower plate portion having a first surface; a lower sidewall portion extending from a periphery of the lower plate portion in a perpendicular direction substantially perpendicular to the first surface of the lower plate portion, wherein the lower sidewall portion comprises a first surface contacting the first surface of the lower plate portion and a second surface opposite to the first surface; and a plurality of reception members extending from the lower sidewall portion and each of the reception members engaging with a corresponding one of the hook members, each of the reception members comprising: a first reception portion engaged with the corresponding first spring plate portion and comprising a first end surface; a second end surface opposite to the first end surface; and a first inclined lower surface between the first end surface and the second end surface, wherein the first inclined lower surface is inclined such that a distance between the first inclined lower surface and the first surface of the lower sidewall portion in the perpendicular direction is gradually increased toward the second end surface; and a second reception portion engaged with the corresponding second spring plate portion and comprising a first end surface facing the first end surface of the first reception portion; a second end surface opposite to the first end surface; and a second inclined lower surface between the first end surface and the second end surface, wherein the second inclined lower surface is inclined such that a distance between the second inclined lower surface and the first surface of the lower sidewall portion in the perpendicular direction is gradually increased toward the second end surface.

According to one or more illustrative aspects of the present invention, the first spring plate portion has a first protrusion portion extending from a surface opposite to the first inclined upper surface toward the inside of the upper enclosure, and the second spring plate portion has a second protrusion portion extending from a surface opposite to the second inclined upper surface toward the inside of the upper enclosure.

According to one or more illustrative aspects of the present invention, the upper enclosure and the lower enclosure are made of copper alloy.

According to one or more illustrative aspects of the present invention, the lower sidewall portion has a plurality of pairs of release holes therein, and one of the pairs of release holes is formed to face the corresponding first spring plate portion, and the other of the pairs of release holes is formed to face the corresponding second spring plate portion (36).

According to one or more illustrative aspects of the present invention, there is provided an electronic apparatus. The electronic apparatus comprises: an electronic component; and the above-mentioned electronic component enclosure enclosing the electronic component.

According to one or more illustrative aspects of the present invention, the electronic component is a storage device.

According to one or more illustrative aspects of the present invention, there is provided an electronic component enclosure. The electronic component enclosure comprises: an upper enclosure comprising: an upper plate portion having a first surface; an upper sidewall portion extending from a periphery of the upper plate portion; and a hook member extending from the upper sidewall portion and comprising: a spring plate portion comprising: a first end surface; a second end surface opposite to the first end surface; an inclined upper surface between the first end surface and the second end surface; and a lower surface opposite to the inclined upper surface, wherein the inclined upper surface is inclined such that a distance between the inclined upper surface and the lower surface is gradually decreased toward the second end surface, a lower enclosure engaged with the upper enclosure, the lower enclosure comprising: a lower plate portion having a first surface; a lower sidewall portion extending from a periphery of the lower plate portion; and a reception member extending from the lower sidewall portion and engaging with the hook member, the reception member comprising: a reception portion engaged with the spring plate portion and comprising a first end surface; a second end surface opposite to the first end surface; an inclined lower surface between the first end surface and the second end surface; and an upper surface opposite to the inclined lower surface, wherein the inclined lower surface is inclined such that a distance between the inclined lower surface and the upper surface is gradually decreased toward the second end surface, wherein the first end surface of the reception portion corresponds to the first end surface of the spring plate portion, and the second end surface of the reception portion corresponds to the second end surface of the spring plate portion.

When the upper enclosure is pushed into the lower enclosure, the first and second inclined upper surfaces are fixedly hooked on the first and second inclined lower surfaces. As such, the upper enclosure and the lower enclosure can be fixed reliably and firmly.

Since the hook member of the upper enclosure is received inside the casing, it is difficult for a user to disengage the upper enclosure from the lower enclosure intentionally. Further, since the hook member of the upper enclosure and the reception member of the lower enclosure cannot be seen from the outside, the appearance of the electronic component enclosure is attractive, and thus the design can be improved.

BRIEF DESCRIPTION OF THE DRAWINGS

FIG. 2 is an exploded perspective view showing an electronic component enclosure according to an embodiment;

DETAILED DESCRIPTION

Figure 1A:
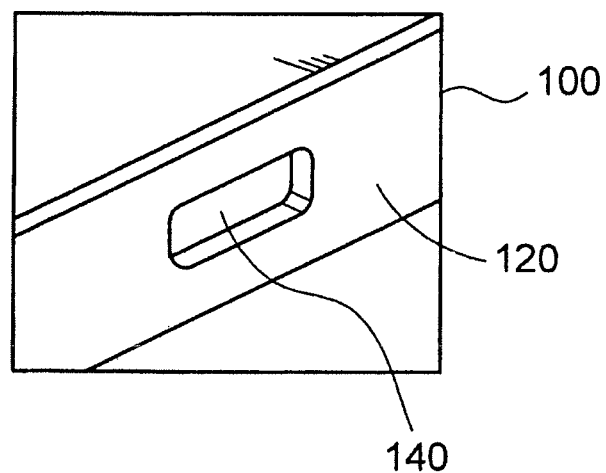
FIGS. 1A and 1B are perspective views showing a method for fixing a lower enclosure and an upper enclosure of an electronic apparatus in the related art.
Figure 1B:
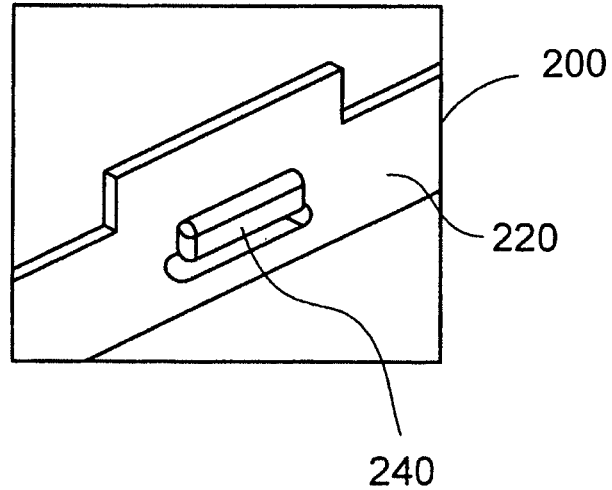

Exemplary embodiments will be now described with reference to the accompanying drawings.

FIG. 2 is an exploded perspective view showing an electronic component enclosure according to an embodiment. As shown in FIG. 2, the electronic component enclosure 1 according to the embodiment is provided for receiving an electronic component therein and includes a quadrangular lower enclosure 10 and a quadrangular upper enclosure 20.

The lower enclosure 10 has a lower enclosure body 16 including a lower plate portion 12 and sidewall portions 14 protruding upward from the periphery of the lower plate portion 12. An opening portion 18 for exposing a connector of an electronic component is provided in a central portion of one of the sidewall portions 14 of the lower enclosure 10.

In addition, the upper enclosure 20 has an upper enclosure body 26 including an upper plate portion 22 and sidewall portions 24 protruding downward from the periphery of the upper plate portion 22. An opening portion 28 for exposing the connector of the electronic component is provided in a central portion of one of the sidewall portions 24 of the upper enclosure 20. The opening portion 28 of the sidewall portion 24 of the upper enclosure 20 is disposed in a position corresponding to the opening portion 18 of the sidewall portion 14 of the lower enclosure 10.

Figure 3A:
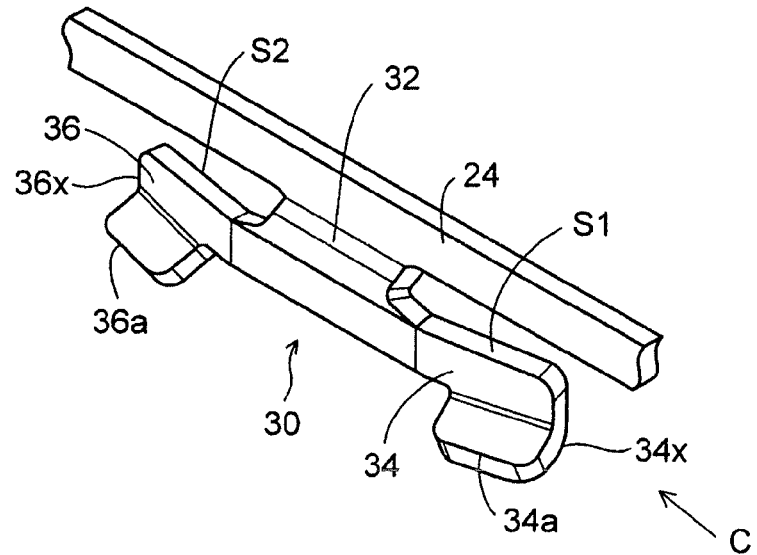
FIGS. 3A and 3B are a partial perspective view and a partial side view showing a hook member formed in an upper enclosure of the electronic component enclosure according to the embodiment.

As shown in a partial perspective view of FIG. 3A, a plurality of hook members 30 are formed under the sidewall portions 24 of the upper enclosure 20 shown in FIG. 2. A hook member 30 disposed in a portion designated by the sign "A" in FIG. 2 is depicted in FIG. 3A.

The hook member 30 has a base portion 32 which is connected to a lower portion of the sidewall portion 24, a first spring plate portion 34 which extends in a direction from the base portion 32, and a second spring plate portion 36 which extends in an opposite direction from the base portion 32. Both the first and second spring plate portions 34 and 36 extend horizontally along the sidewall portion 24 from the base portion 32.

The first spring plate portion 34 of the hook member 30 has a protrusion portion 34a protruding toward the inside of the casing from an end-side lower portion of the first spring plate portion 34 through a bent portion. The lower outer surface of the bent portion of the first spring plate portion 34 is rounded and formed as a curved surface 34x. The curved surface 34x is also referred to as R surface.

Similarly, the second spring plate portion 36 has a protrusion portion 36a protruding inward from an end-side lower portion of the second spring plate portion 36 through a bent portion. Similarly, the lower outer surface of the bent portion of the second spring plate portion 36 is rounded and formed as a curved surface 36x.

Figure 3B:
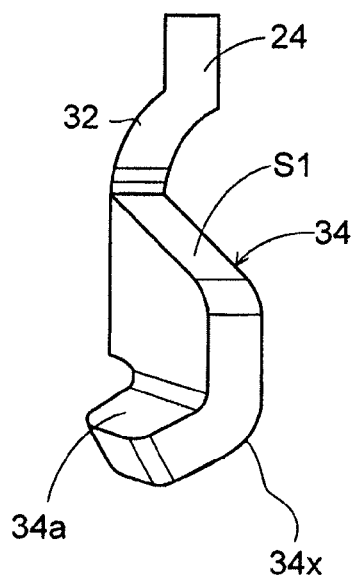

FIG. 3B is a partial side view of the hook member 30 shown in FIG. 3A, seen right from a cross direction C. In addition, with reference to FIG. 3B, an upper surface of the first spring plate portion 34 of the hook member 30 is formed as a first inclined upper surface S1 with a height decreasing as goes closer to an end side. That is, the first inclined upper surface S1 of the first spring plate portion 34 has a height decreasing as goes farther from the base portion 32.

Similarly, an upper surface of the second spring plate portion 36 of the hook member 30 is formed as a second inclined upper surface S2 with a height decreasing as goes closer to an end side.

As shown in FIG. 3B, the first spring plate portion 34 of the hook member 30 is disposed to be curved toward the outside of the casing from the base portion 32. Similarly, the second spring plate portion 36 of the hook member 30 is disposed to be curved toward the outside of the casing from the base portion 32.

Figure 4A:
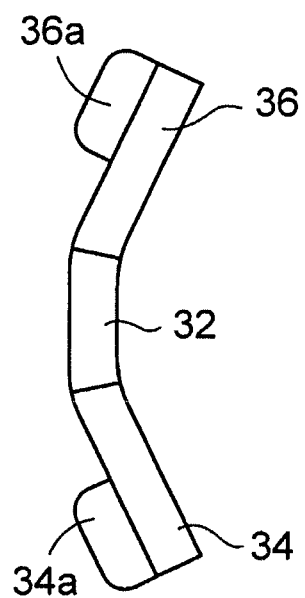
FIGS. 4A and 4B are plan views showing a state in which spring plate portions of the hook member in FIG. 3A are pressed to be opened.

That is, when the hook member 30 shown in FIGS. 3A and 3B is seen right from above, the first and second spring plate portions 34 and 36 are formed into a shape broadening out toward the outside of the casing from the opposite ends of the base portion 32, as shown in FIG. 4A.

Figure 4B:
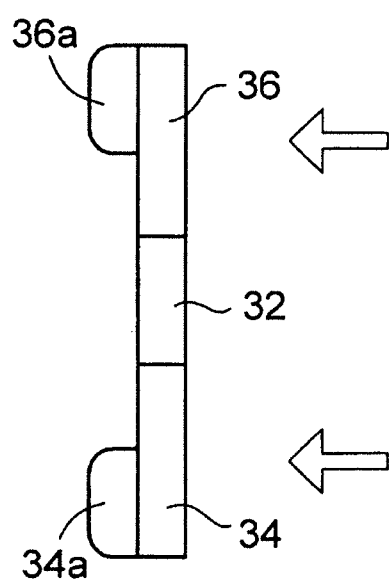

When the first and second spring plate portions 34 and 36 of the hook member 30 are pressed toward the inside of the casing, the first and second spring plate portions 34 and 36 are opened like a flat plate together with the base portion 32, as shown in FIG. 4B. When released from the pressing force, the first and second spring plate portions 34 and 36 are returned to their original broadening-out shapes.

In this manner, a plurality of hook members 30 are formed side by side under each sidewall portion 24 of the upper enclosure 20. For example, four or five hook members 30 are disposed on the lower surface of each sidewall portion 24 of the upper enclosure 20.

Since the upper enclosure 20 is provided with the hook members 30 each having the first and second spring plate portions 34 and 36, the upper enclosure 20 is made of stainless steel (SUS) or copper alloy having springiness. Copper nickel alloy, copper chromium alloy or the like may be used as the copper alloy.

The upper enclosure 20 provided with the hook members 30 is produced by integrally molding a metal thin plate by press working. Since copper alloy has springiness and high heat conductivity, copper alloy can be used preferably when the casing needs to have high heat radiation performance.

In the example of FIGS. 3A and 3B, the base portion 32 of the hook member 30 is connected to the lower surface of the sidewall portion 24 of the upper enclosure 20. Alternatively, the base portion 32 may be connected to an inner surface of the sidewall portion 24.

A reception member 40 of the lower enclosure 10 for fixedly hooking the hook member 30 of the aforementioned upper enclosure 20 will be described below.

Figure 5A:
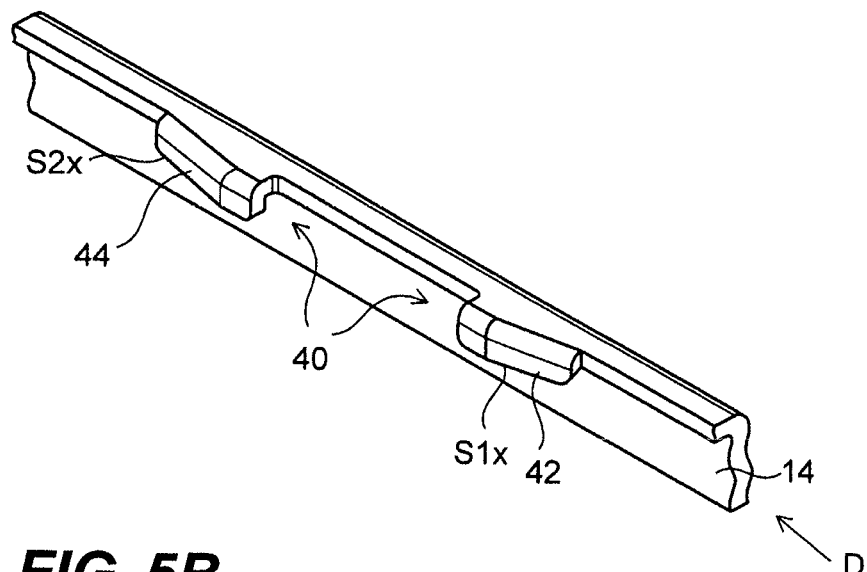
FIGS. 5A and 5B are a perspective view and a side view showing a reception member formed in a lower enclosure of the electronic component enclosure according to the embodiment.
Figure 5B:
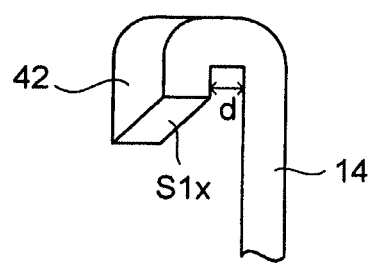

As shown in a partial perspective view of FIG. 5A, reception members 40 are formed in positions corresponding to the hook members 30 of the aforementioned upper enclosure 20 respectively on an inner-side upper portion of each sidewall portion 14 of the lower enclosure 10 shown in FIG. 2. A reception member 40 disposed in a portion designated by the sign "B" in FIG. 2 is depicted in FIG. 5A. FIG. 5B is a partial side view of the reception member 40 shown in FIG. 5A, seen right from a cross direction D.

As shown in FIGS. 5A and 5B, the reception member 40 of the lower enclosure 10 has a first reception portion 42 corresponding to the first spring plate portion 34 of the hook member 30 of the upper enclosure 20, and a second reception portion 44 corresponding to the second spring plate portion 36 of the same hook member 30.

The first reception portion 42 of the reception member 40 is formed to be bent toward the inside of the casing from an upper portion of the sidewall portion 14 of the lower enclosure 10 and extend downward. An interval d is provided between the first reception portion 42 and the sidewall portion 14.

As shown in FIGS. 5A and 5B, a lower surface of the first reception portion 42 is formed as a first inclined lower surface $S1x$ which is inclined reversely to the first inclined upper surface S1 of the first spring plate portion 34 of the hook member 30 of the upper enclosure 20. That is, the first inclined lower surface $S1x$ of the first reception portion 42 is inclined so that the height of the first inclined lower surface $S1x$ increases as goes farther from the second reception portion 44.

Similarly, as shown in FIG. 5A, the second reception portion 44 of the reception member 40 is formed to be bent toward the inside of the casing from the upper portion of the sidewall portion 14 of the lower enclosure 10 and extend downward. Although not shown, an interval d is provided between the second reception portion 44 and the sidewall portion 14, similarly to the first reception portion 42.

Similarly, as shown in FIG. 5A, a lower surface of the second reception portion 44 is formed as a second inclined lower surface $S2x$ which is inclined reversely to the second inclined upper surface S2 of the second spring plate portion 36 of the hook member 30 of the upper enclosure 20. That is, the second inclined lower surface $S2x$ of the second reception portion 44 is inclined so that the height of the second inclined lower surface $S2x$ increases as goes farther from the first reception portion 42.

The first and second inclined lower surfaces $S1x$ and $S2x$ of the reception member 40 of the lower enclosure 10 are disposed in positions corresponding to the first and second inclined upper surfaces S1 and S2 of the hook member 30 of the upper enclosure 20.

The lower enclosure 10 is produced by pressing a thin plate of metal such as stainless steel (SUS) or copper alloy, in the same manner as the upper enclosure 20.

In the example of FIGS. 5A and 5B, the reception member 40 is formed to be connected to an upper surface of the sidewall portion 14 of the lower enclosure 10. Alternatively, the reception member 40 may be formed to be connected to an inner surface of the sidewall portion 14. That is, the reception member 40 may be disposed on an inner side of the sidewall portion 14 of the lower enclosure 10.

Figure 6A:
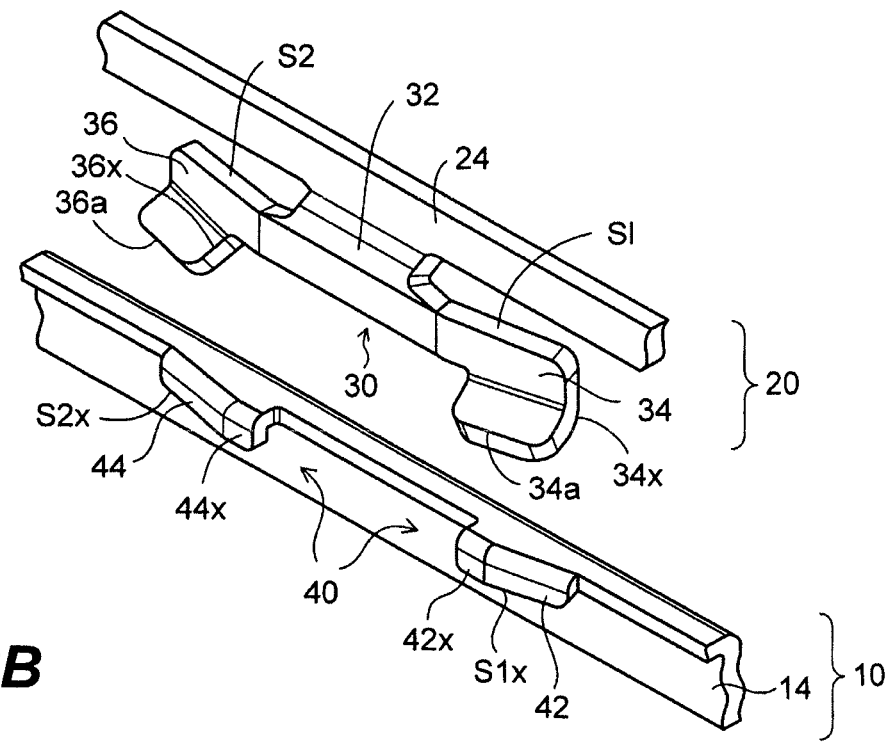
FIGS. 6A and 6B are partial perspective views (#1) showing a state in which the hook member of the upper enclosure is to be engaged with the reception member of the lower enclosure.

As shown in FIG. 6A, the upper enclosure 20 is disposed on the lower enclosure 10 so that the hook members 30 of the upper enclosure 20 correspond to the reception members 40 of the lower enclosure 10.

Figure 6B:
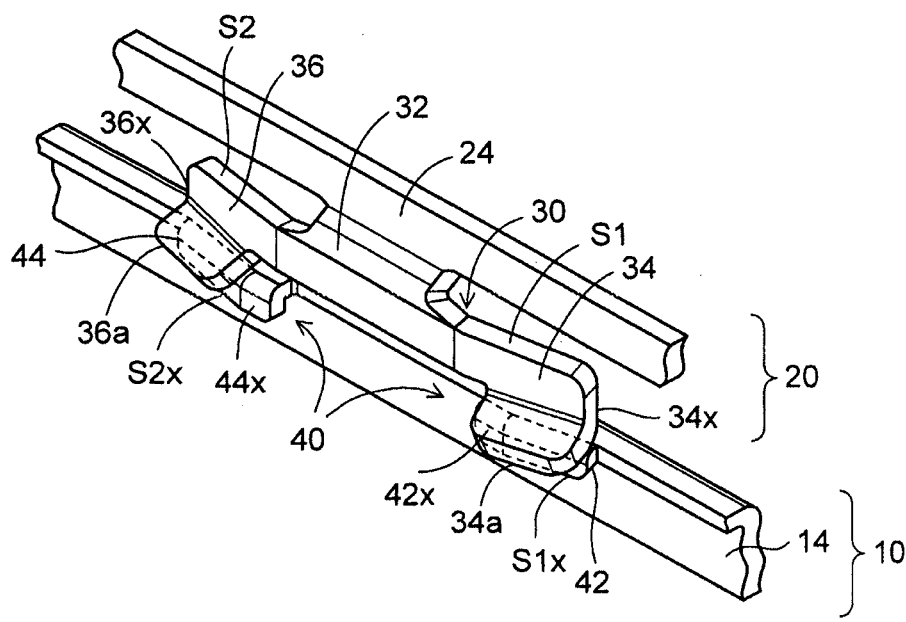

Further, as shown in FIG. 6B, when the upper enclosure 20 is pressed against the lower enclosure 10 side, the curved surfaces $34x$ and $36x$ of the first and second spring plate portions 34 and 36 of the hook members 30 of the upper enclosure 20 abut against side surfaces $42x$ and $44x$ of the first and second reception portions 42 and 44 of the reception members 40 of the lower enclosure 10, respectively.

On this occasion, the first and second spring plate portions 34 and 36 of each hook member 30 is provided with the curved surfaces $34x$ and $36x$ in the lower portions. In this manner, the hook member 30 of the upper enclosure 20 can be pushed downward along the side surfaces $42x$ and $44x$ of the reception member 40 of the lower enclosure 10 smoothly.

Figure 7A:
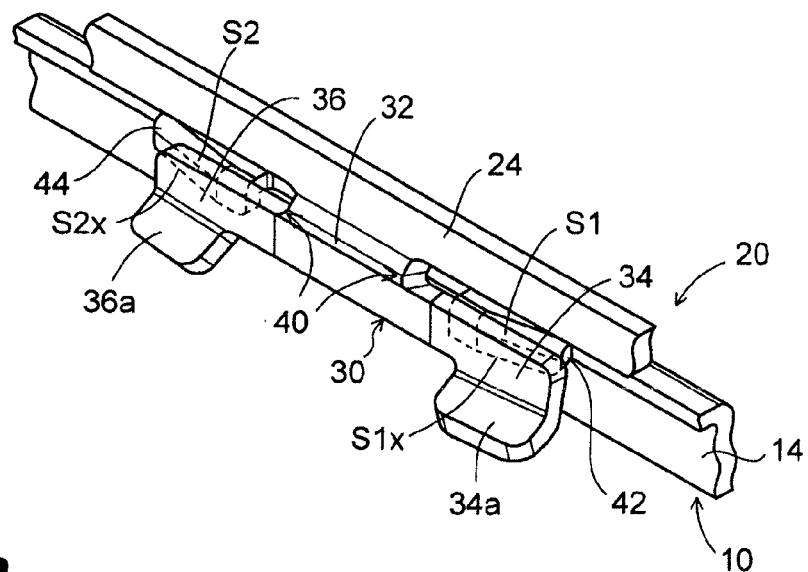
FIGS. 7A and 7B are partial perspective views (#2) showing a state in which the hook member of the upper enclosure is engaged with the reception member of the lower enclosure.

Further, when the upper enclosure 20 is pushed downward, the first spring plate portion 34 and the second spring plate portion 36 of the hook member 30 of the upper enclosure 20 are pressed toward the inside of the casing by the reception member 40 of the lower enclosure 10, as shown in FIG. 7A. As a result, as shown in FIG. 4B which has been described above, the first spring plate portion 34 and the second spring plate portion 36 of the hook member 30 are opened toward the inside of the casing so that the first spring plate portion 34 and the second spring plate portion 36 are formed like a flat plate together with the base portion 32.

Figure 7B:
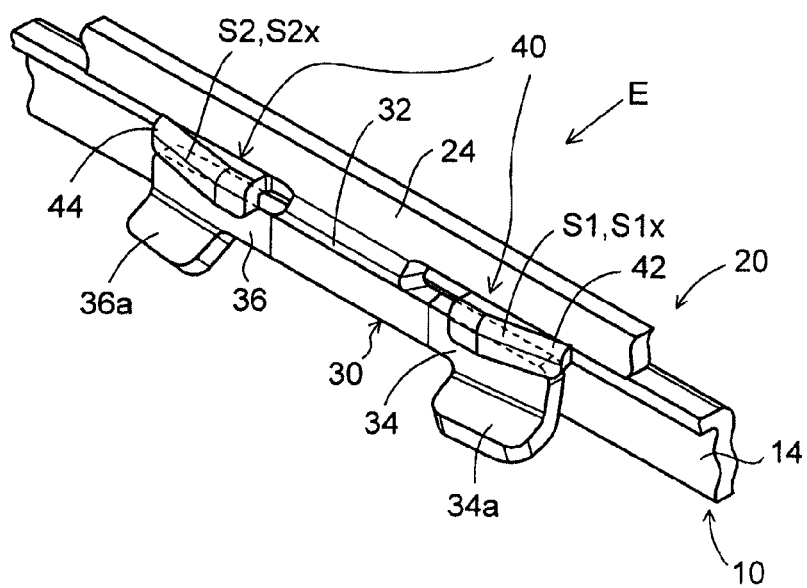

When the upper enclosure 20 is further pressed against the lower enclosure 10 side, the first and second inclined upper surfaces S1 and S2 of the hook member 30 of the upper enclosure 20 fall to the first and second inclined lower surfaces S1x and S2x of the reception member 40 of the lower enclosure 10 so as to be fitted thereto, as shown in FIG. 7B.

On this occasion, the first and second spring plate portions 34 and 36 of the hook member 30 of the upper enclosure 20 are released from the pressing force from the reception member 40 of the lower enclosure 10. Thus, the first and second spring plate portions 34 and 36 are returned to their original broadening-out shapes by spring force as shown in FIG. 4A which has been describe above.

In this manner, a part of the first inclined upper surface S1 of the first spring plate portion 34 of the hook member 30 of the upper enclosure 20 is fixedly hooked on the first inclined lower surface S1x of the first reception portion 42 of the reception member 40 of the lower enclosure 10.

At the same time, a part of the second inclined upper surface S2 of the second spring plate portion 36 of the hook member 30 of the upper enclosure 20 is fixedly hooked on the second inclined lower surface S2x of the second reception portion 44 of the reception member 40 of the lower enclosure 10.

The reason why the inclined upper surfaces S1 and S2 of the first and second spring plate portions 34 and 36 of the upper enclosure 20 are inclined reversely to the inclined lower surfaces S1x and S2x of the reception member 40 of the lower enclosure 10 will be described as follows.

Since a manufacturing error is generated when the upper enclosure 20 and the lower enclosure 10 are produced, the heights of the first and second spring plate portions 34 and 36 of the upper enclosure 20 and the heights of the reception members 40 of the lower enclosure 10 are often formed with a variation.

The case where the upper surfaces of the first and second spring plate portions 34 and 36 of the upper enclosure 20 are disposed in parallel with the lower surfaces of the reception members 40 of the lower enclosure 10, differently from the embodiment, will be described. In this case, it is difficult to hook the upper surfaces of all the first and second spring plate portions 34 and 36 of the upper enclosure 20 onto the lower surfaces of the reception members 40 of the lower enclosure 10 because of the manufacturing error.

In the embodiment, the upper surfaces of the first and second spring plate portions 34 and 36 of the upper enclosure 20 are inclined reversely to the lower surfaces of the reception members 40 of the lower enclosure 10. Accordingly, the variation in the heights of the first and second spring plate portions 34 and 36 can be absorbed.

Accordingly, the inclined upper surfaces S1 and S2 of all the first and second spring plate portions 34 and 36 of the upper enclosure 20 can be stably hooked on the inclined lower surfaces S1x and S2x of the reception members 40 of the lower enclosure 10.

As described above, the hook members 30 of the upper enclosure 20 are hooked on the reception members 40 of the lower enclosure 10. Accordingly, the upper enclosure 20 and the lower enclosure 10 can be fixed to each other reliably and firmly.

Incidentally, the embodiment has been described in the case where each of the hook members 30 of the upper enclosure 20 is provided with the first and second spring plate portions 34 and 36 on the opposite sides of the base portion 32 as a preferred example in order to enhance the attachment strength. As an alternative embodiment, a spring plate portion may be formed only on a single side of the base portion 32. When one spring plate portion is formed in each hook member 30 of the upper enclosure 20, one reception portion is formed in each reception member 40 of the lower enclosure 10 correspondingly.

An electronic apparatus using the electronic component enclosure 1 according to the embodiment will be described below. The case where the electronic component enclosure 1 is used as a casing for an SSD (Solid State Drive) as an example of a storage cell will be described by way of example in the embodiment. The SSD which uses a flash memory as a storage medium is used as a main storage device of a personal computer or the like.

Figure 8:
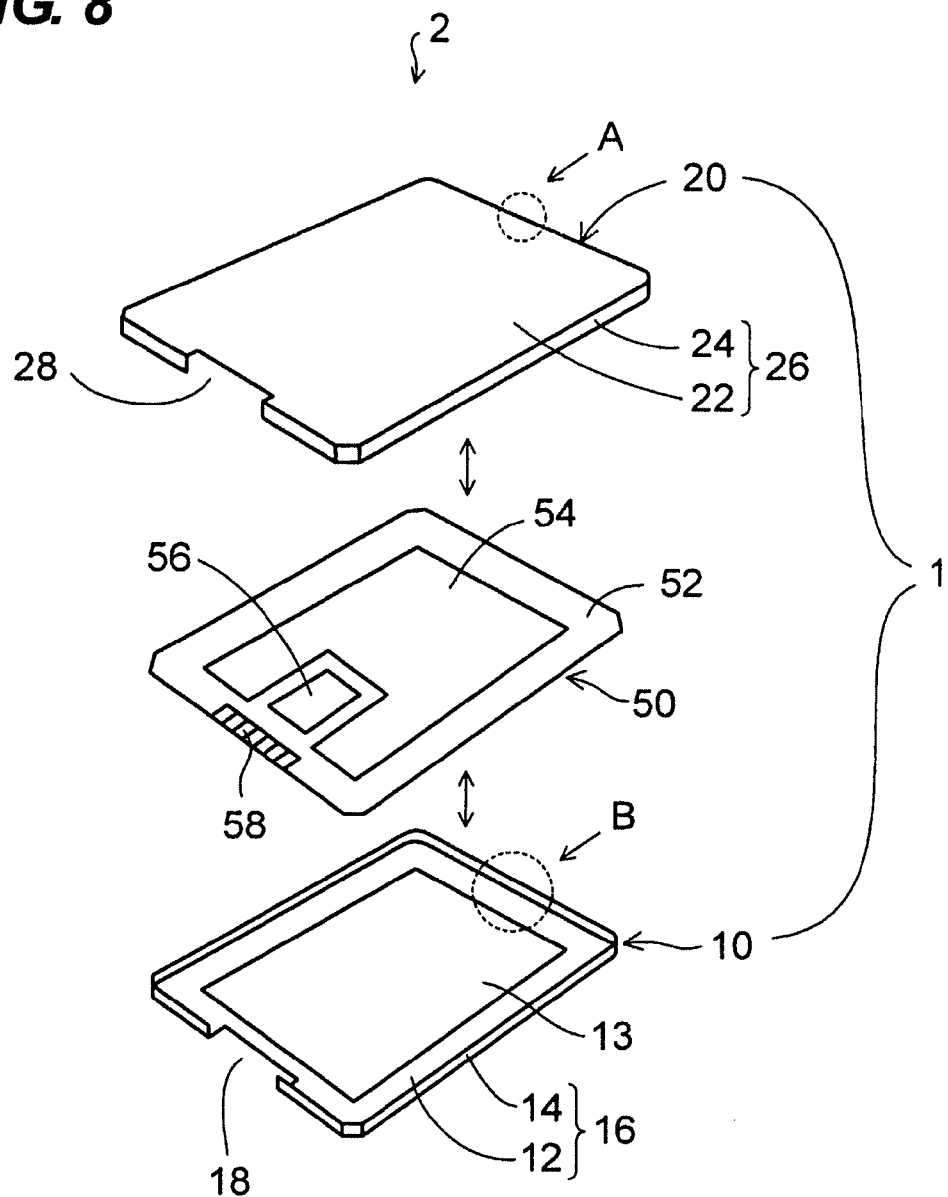
FIG. 8 is an exploded perspective view showing an electronic apparatus according to an embodiment.

As shown in FIG. 8, an SSD board 50 received in the electronic component enclosure 1 is formed in such a manner that a flash memory module 54, a controller chip 56, etc. are mounted on a wiring substrate 52. A connector portion 58 is provided in a central portion of one side of the SSD board 50.

The lower enclosure 10 and the upper enclosure 20 of the electronic component enclosure 1 are prepared. An elastic heat transfer sheet 13 is formed on the inner surface of the lower enclosure 10. The same heat transfer sheet 13 (not shown) is also formed on the inner surface of the upper enclosure 20. Then, the SSD board 50 is disposed on the lower enclosure 10. As shown in FIG. 7B which has been described above, the hook members 30 of the upper enclosure 20 are fitted to the reception members 40 of the lower enclosure 10.

In this manner, the SSD board 50 is received in the electronic component enclosure 1. The connector portion 58 of the SSD board 50 is exposed from the opening portions 18 and 28 of the lower and upper enclosures 10 and 20.

The SSD board 50 is received in the lower and upper enclosures 10 and 20 in the state in which the SSD board 50 is in tight contact with the heat transfer sheets 13. Accordingly, the SSD board 50 can be prevented from being rattled.

Further, heat emitted from the SSD board 50 can be radiated efficiently to the outside by the heat transfer sheets 13. To obtain higher heat radiation performance, the lower enclosure 10 and the upper enclosure 20 may be made of copper alloy etc. with high heat conductivity.

An electronic apparatus 2 can be constituted by the SSD board 50 and the electronic component enclosure 1 receiving the SSD board 50 therein.

The electronic component enclosure 1 according to the embodiment has such a structure that the first and second spring plate portions 34 and 36 of the hook members 30 of the upper enclosure 20 are engaged firmly with the reception members 40 of the lower enclosure 10.

Therefore, even when the electronic apparatus 2 falls down or receives a shock from the outside, the upper enclosure 20 and the lower enclosure 10 can be prevented from coming off so that the upper enclosure 20 and the lower enclosure 10 can be fixed to each other reliably and firmly.

Since the hook members 30 of the upper enclosure 20 are received inside the casing, it is difficult for a user to disengage the hook members 30 of the upper enclosure 20 from the reception members 40 of the lower enclosure 10 intentionally.

As shown in FIG. 7B which has been described above, the hook members 30 of the upper enclosure 20 are engaged with the reception members 40 formed on the inner side of the sidewall portions 14 of the lower enclosure 10 so as to be received inside the casing. Therefore, when FIG. 7B which has been described above is seen from the outside E, there is no protrusion protruding outward in the sidewall portions 14 of the lower enclosure 10. Accordingly, the appearance of the electronic component enclosure 1 is so attractive that the design can be improved.

In the electronic component enclosure 1 according to the embodiment, the upper enclosure 20 can be removed easily from the lower enclosure 10 if necessary.

Figure 9:
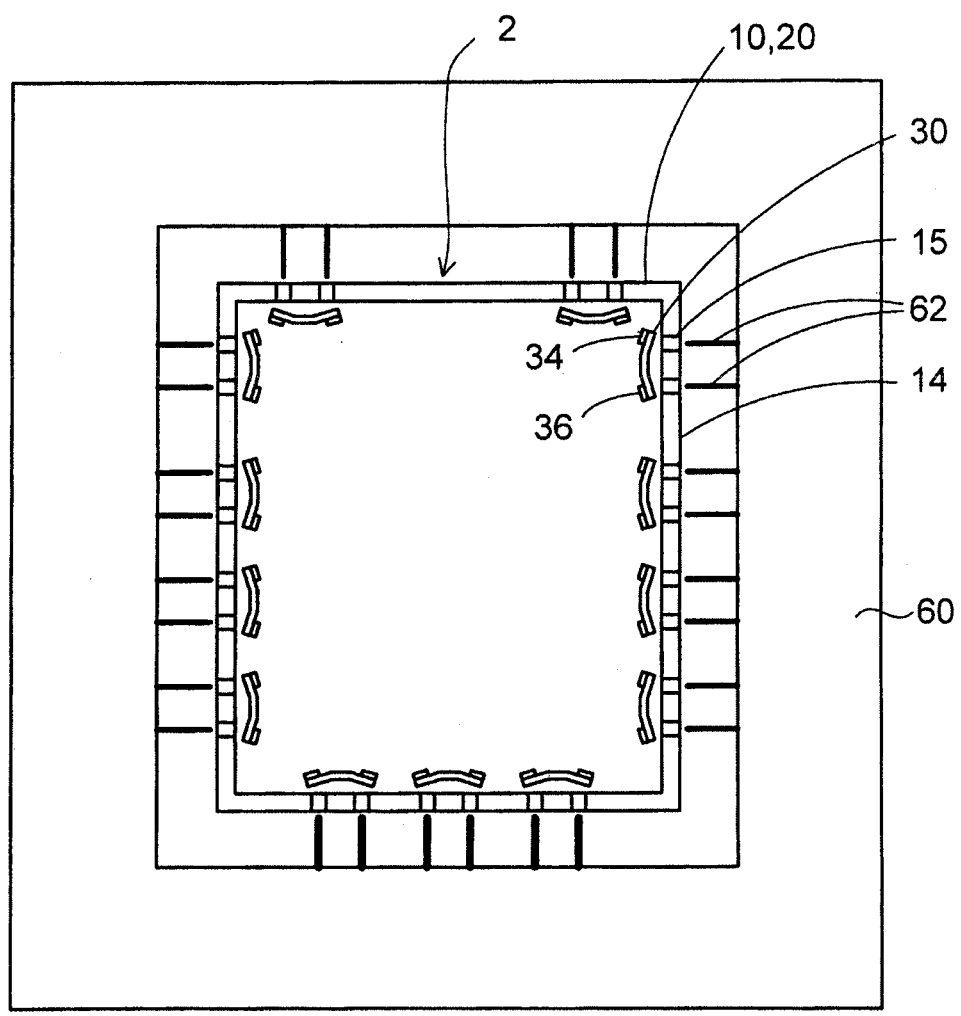
FIG. 9 is a transparent plan view schematically showing a state in which a releasing jig has been disposed on the electronic component enclosure according to the embodiment.

FIG. 9 is a transparent plan view schematically showing a state in which a releasing jig has been disposed on the electronic apparatus according to the embodiment. In the electronic apparatus 2 in FIG. 9, only the lower and upper enclosures 10 and 20 and the hook members 30 of the upper enclosure 20 are shown while the other elements are omitted.

As shown in FIG. 9, release holes 15 are provided respectively in positions corresponding to the opposite end portions of the first and second spring plate portions 34 and 36 of the hook members 30 of the upper enclosure 20 in the sidewall portions 14 of the lower enclosure 10.

The releasing jig 60 is disposed on the periphery of the electronic apparatus 2. Pressing pins 62 are provided respectively in positions corresponding to the release holes 15 of the lower enclosure 10 in the releasing jig 60. The pressing pins 62 of the releasing jig 60 are inserted into the release holes 15 of the lower enclosure 10 so that the opposite end portions of the first and second spring plate portions 34 and 36 of each hook member 30 of the upper enclosure 20 can be pressed simultaneously by the pressing pins 62.

Thus, all the hook members 30 of the upper enclosure 20 can be opened like a flat plate so that the first and second spring plate portions 34 and 36 can be disengaged from the reception members 40 of the lower enclosure 10 with the result that the upper enclosure 20 can be disengaged from the lower enclosure 10.

In this manner, the release holes 15 are formed in the sidewall portions 14 of the lower enclosure 10 in advance. The special-purpose releasing jig 60 is used so that reworking can be performed if necessary.

Although the SSD board 50 which is a storage cell is exemplified as an electronic component received in the electronic component enclosure 1 in the aforementioned embodiment, the casing can be used as a casing for various electronic components.

While the preferred embodiments and their modifications and examples have been described now, the present invention is not limited to the preferred embodiments and their modifications and examples described above, and the preferred embodiments and their modifications and examples may be modified and replaced in various ways without deviating from the scope defined in the appended claims.

What is claimed is:

1. An electronic component enclosure comprising:
  an upper enclosure comprising:
    an upper plate portion having a first surface;
    an upper sidewall portion extending from a periphery of the upper plate portion in a perpendicular direction substantially perpendicular to the first surface of the upper plate portion, wherein the upper sidewall portion comprises a first surface contacting the first surface of the upper plate portion and a second surface opposite to the first surface; and
    a plurality of hook members extending from the upper sidewall portion and each comprising:
      a base portion having a first side and a second side opposite to the first side;
      a first spring plate portion connected to the first side of the base portion and comprising: a first end surface contacting the first side of the base portion; a second end surface opposite to the first end surface; and a first inclined upper surface between the first end surface and the second end surface, wherein the first inclined upper surface is inclined such that a distance between the first inclined upper surface and the second surface of the upper sidewall portion in the perpendicular direction is gradually increased toward the second end surface of the first spring plate portion; and
      a second spring plate portion connected to the second side of the base portion and comprising a first end surface contacting the second side of the base portion; a second end surface opposite to the first end surface; and a second inclined upper surface between the first end surface and the second end surface, wherein the second inclined upper surface is inclined such that a distance between the second inclined upper surface and the second surface of the upper sidewall portion in the perpendicular direction is gradually increased toward the second end surface of the second spring plate portion,
  a lower enclosure engaged with the upper enclosure, the lower enclosure comprising:
    a lower plate portion having a first surface;
    a lower sidewall portion extending from a periphery of the lower plate portion in a perpendicular direction substantially perpendicular to the first surface of the lower plate portion, wherein the lower sidewall portion comprises a first surface contacting the first surface of the lower plate portion and a second surface opposite to the first surface; and
    a plurality of reception members extending from the lower sidewall portion and each of the reception members engaging with a corresponding one of the hook members, each of the reception members comprising:
      a first reception portion engaged with the corresponding first spring plate portion and comprising a first end surface; a second end surface opposite to the first end surface; and a first inclined lower surface between the first end surface and the second end surface, wherein the first inclined lower surface is inclined such that a distance between the first inclined lower surface and the first surface of the lower sidewall portion in the perpendicular direction is gradually increased toward the second end surface; and
      a second reception portion engaged with the corresponding second spring plate portion and comprising a first end surface facing the first end surface of the first reception portion; a second end surface opposite to the first end surface; and a second inclined lower surface between the first end surface and the second end surface, wherein the second inclined lower surface is inclined such that a distance between the second inclined lower surface and the first surface of the lower sidewall portion in the perpendicular direction is gradually increased toward the second end surface.

2. The electronic component enclosure of claim 1, wherein the first spring plate portion has a first protrusion portion extending from a surface opposite to the first inclined upper surface toward the inside of the upper enclosure, and
wherein the second spring plate portion has a second protrusion portion extending from a surface opposite to the second inclined upper surface toward the inside of the upper enclosure.

3. The electronic component enclosure of claim 1, wherein the upper enclosure and the lower enclosure are made of copper alloy.

4. The electronic component enclosure of claim 1, wherein the lower sidewall portion has a plurality of pairs of release holes therein, and one of the pairs of release holes is formed to face the corresponding first spring plate portion, and the other of the pairs of release holes is formed to face the corresponding second spring plate portion.

5. An electronic apparatus comprising:
an electronic component; and
an electronic component enclosure enclosing the electronic component, comprising:
an upper enclosure comprising:
  an upper plate portion having a first surface;
  an upper sidewall portion extending from a periphery of the upper plate portion in a perpendicular direction substantially perpendicular to the first surface of the upper plate portion, wherein the upper sidewall portion comprises a first surface contacting the first surface of the upper plate portion and a second surface opposite to the first surface; and
  a plurality of hook members extending from the upper sidewall portion and each comprising:
    a base portion having a first side and a second side opposite to the first side;
    a first spring plate portion connected to the first side of the base portion and comprising: a first end surface contacting the first side of the base portion; a second end surface opposite to the first end surface; and a first inclined upper surface between the first end surface and the second end surface, wherein the first inclined upper surface is inclined such that a distance between the first inclined upper surface and the second surface of the upper sidewall portion in the perpendicular direction is gradually increased toward the second end surface of the first spring plate portion; and
    a second spring plate portion connected to the second side of the base portion and comprising a first end surface contacting the second side of the base portion; a second end surface opposite to the first end surface; and a second inclined upper surface between the first end surface and the second end surface, wherein the second inclined upper surface is inclined such that a distance between the second inclined upper surface and the second surface of the upper sidewall portion in the perpendicular direction is gradually increased toward the second end surface of the second spring plate portion,
a lower enclosure engaged with the upper enclosure, the lower enclosure comprising:
  a lower plate portion having a first surface;
  a lower sidewall portion extending from a periphery of the lower plate portion in a perpendicular direction substantially perpendicular to the first surface of the lower plate portion, wherein the lower sidewall portion comprises a first surface contacting the first surface of the lower plate portion and a second surface opposite to the first surface; and
  a plurality of reception members extending from the lower sidewall portion and each of the reception members engaging with a corresponding one of the hook members, each of the reception members comprising:
    a first reception portion engaged with the corresponding first spring plate portion and comprising a first end surface; a second end surface opposite to the first end surface; and a first inclined lower surface between the first end surface and the second end surface, wherein the first inclined lower surface is inclined such that a distance between the first inclined lower surface and the first surface of the lower sidewall portion in the perpendicular direction is gradually increased toward the second end surface; and
    a second reception portion engaged with the corresponding second spring plate portion and comprising a first end surface facing the first end surface of the first reception portion; a second end surface opposite to the first end surface; and a second inclined lower surface between the first end surface and the second end surface, wherein the second inclined lower surface is inclined such that a distance between the second inclined lower surface and the first surface of the lower sidewall portion in the perpendicular direction is gradually increased toward the second end surface.

6. The electronic apparatus of claim 5, wherein: the electronic component is a storage device.

7. An electronic component enclosure comprising:
an upper enclosure comprising:
  an upper plate portion having a first surface;
  an upper sidewall portion extending from a periphery of the upper plate portion; and
  a hook member extending from the upper sidewall portion and comprising:
    a spring plate portion comprising: a first end surface; a second end surface opposite to the first end surface; an inclined upper surface between the first end surface and the second end surface; and a lower surface opposite to the inclined upper surface, wherein the inclined upper surface is inclined such that a distance between the inclined upper surface and the lower surface is gradually decreased toward the second end surface,
a lower enclosure engaged with the upper enclosure, the lower enclosure comprising:
  a lower plate portion having a first surface;
  a lower sidewall portion extending from a periphery of the lower plate portion; and
  a reception member extending from the lower sidewall portion and engaging with the hook member, the reception member comprising:
    a reception portion engaged with the spring plate portion and comprising a first end surface; a second end surface opposite to the first end surface; an inclined lower surface between the first end surface and the second end surface; and an upper surface opposite to the inclined lower surface, wherein the inclined lower surface is inclined such that a distance between the inclined lower surface and the upper surface is gradually decreased toward the second end surface,
  wherein the first end surface of the reception portion corresponds to the first end surface of the spring plate portion, and the second end surface of the reception portion corresponds to the second end surface of the spring plate portion.

* * * * *